United States Patent [19]

Lenderking et al.

[11] 4,442,476
[45] Apr. 10, 1984

[54] VERSATILE PRINTED CIRCUIT BOARD TERMINATION RACK

[75] Inventors: Bruce N. Lenderking, Glen Burnie; Casper J. Bocklage, Jr., Baltimore, both of Md.

[73] Assignee: Westinghouse Electric Corp., Pittsburgh, Pa.

[21] Appl. No.: 293,551

[22] Filed: Aug. 17, 1981

[51] Int. Cl.³ .............................................. H05K 7/18
[52] U.S. Cl. .................................. 361/395; 361/394; 361/415
[58] Field of Search ............... 361/415, 395, 394, 393, 361/392, 426

[56] References Cited

U.S. PATENT DOCUMENTS 3,992,654 11/1976 Springer et al. ..................... 361/415
4,247,882 1/1981 Prager et al. ..................... 361/395 X
4,334,261 6/1982 Gonzales ......................... 361/415 X

FOREIGN PATENT DOCUMENTS 2740971 3/1979 Fed. Rep. of Germany ...... 361/395
628572 9/1978 U.S.S.R. .............................. 361/415

Primary Examiner—R. R. Kucia
Attorney, Agent, or Firm—M. P. Lynch

[57] ABSTRACT

A termination rack suitable for mounting in a 19 inch instrument cabinet is designed to provide separate cable troughs associated with each of a plurality of printed circuit board housings to permit versatile and high density packaging of electronic circuitry.

2 Claims, 5 Drawing Figures

VERSATILE PRINTED CIRCUIT BOARD TERMINATION RACK

BACKGROUND OF THE INVENTION

New electronic systems, and even additions to existing systems, are now frequently implemented using microcomputer circuitry and associated peripherals. The use of high performance microcomputer circuitry has resulted in greater processing capability in a compact space. The limiting element to package size is now the termination of large numbers of field wires at the printed circuit board termination racks mounted in conventional 19 inch instrument cabinets. In order to realize the benefit of the high performance computational power provided in a small microcomputer package, it is necessary to provide a high performance, high density field termination rack design. Conventional termination rack/cabinet configurations do not provide for efficient and effective cable troughs or passages to realize the package density capabilities of microcomputer circuitry nor do they provide for the desired versatility of cable routing to satisfy unique safety requirements of a particular circuitry, and easy access for maintenance, service and testing.

SUMMARY OF THE INVENTION

There is disclosed herein with reference to the accompanying drawings a versatile termination rack design suitable for either vertical or horizontal mounting in a cabinet wherein a separate cable trough is associated with each of several printed circuit board connections comprising the termination rack.

DESCRIPTION OF THE DRAWINGS

The invention will become more readily apparent from the following exemplary description in connection with the accompanying drawing.

DESCRIPTION OF THE PREFERRED EMBODIMENT

Figure 1:
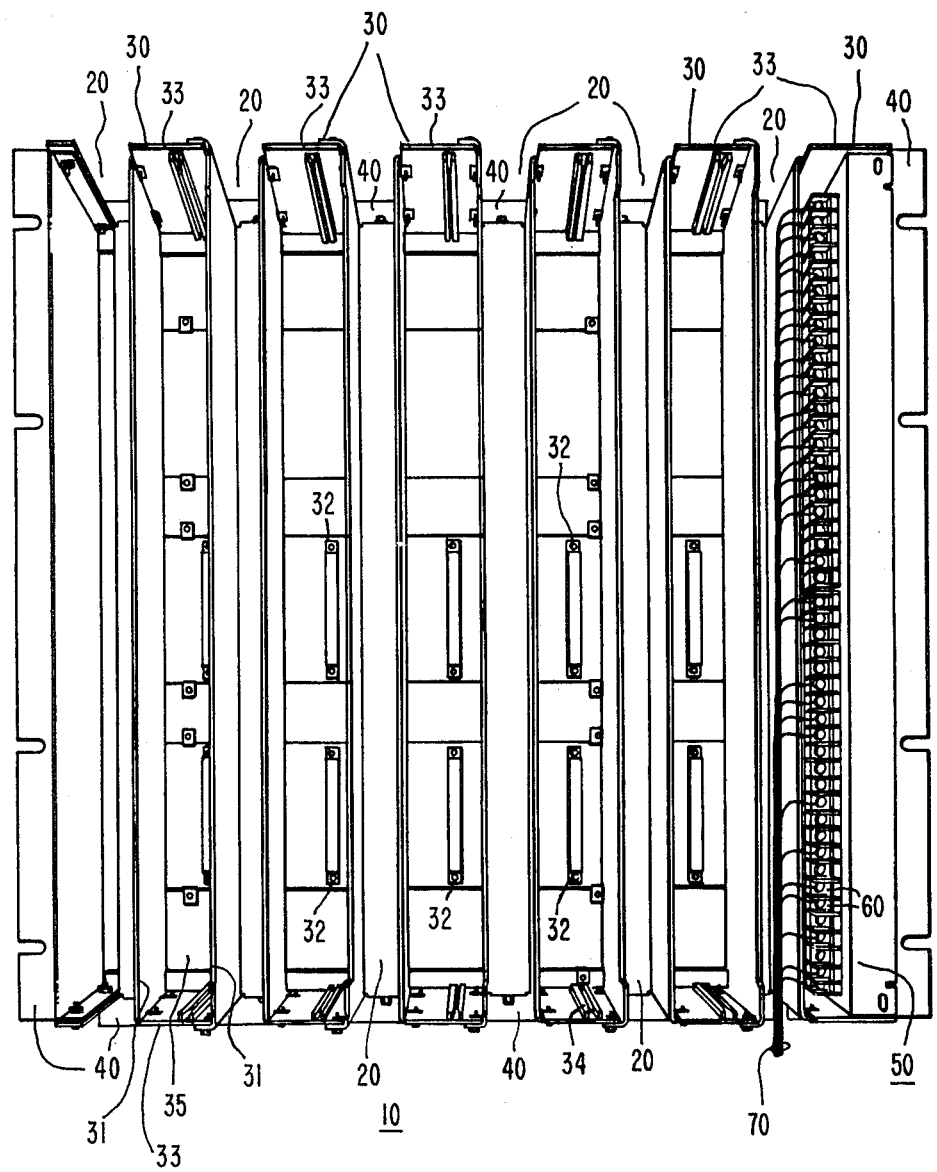
FIG. 1 is a front view of a 19 inch printed circuit board mounting/termination rack employing the invention.
Figure 2:
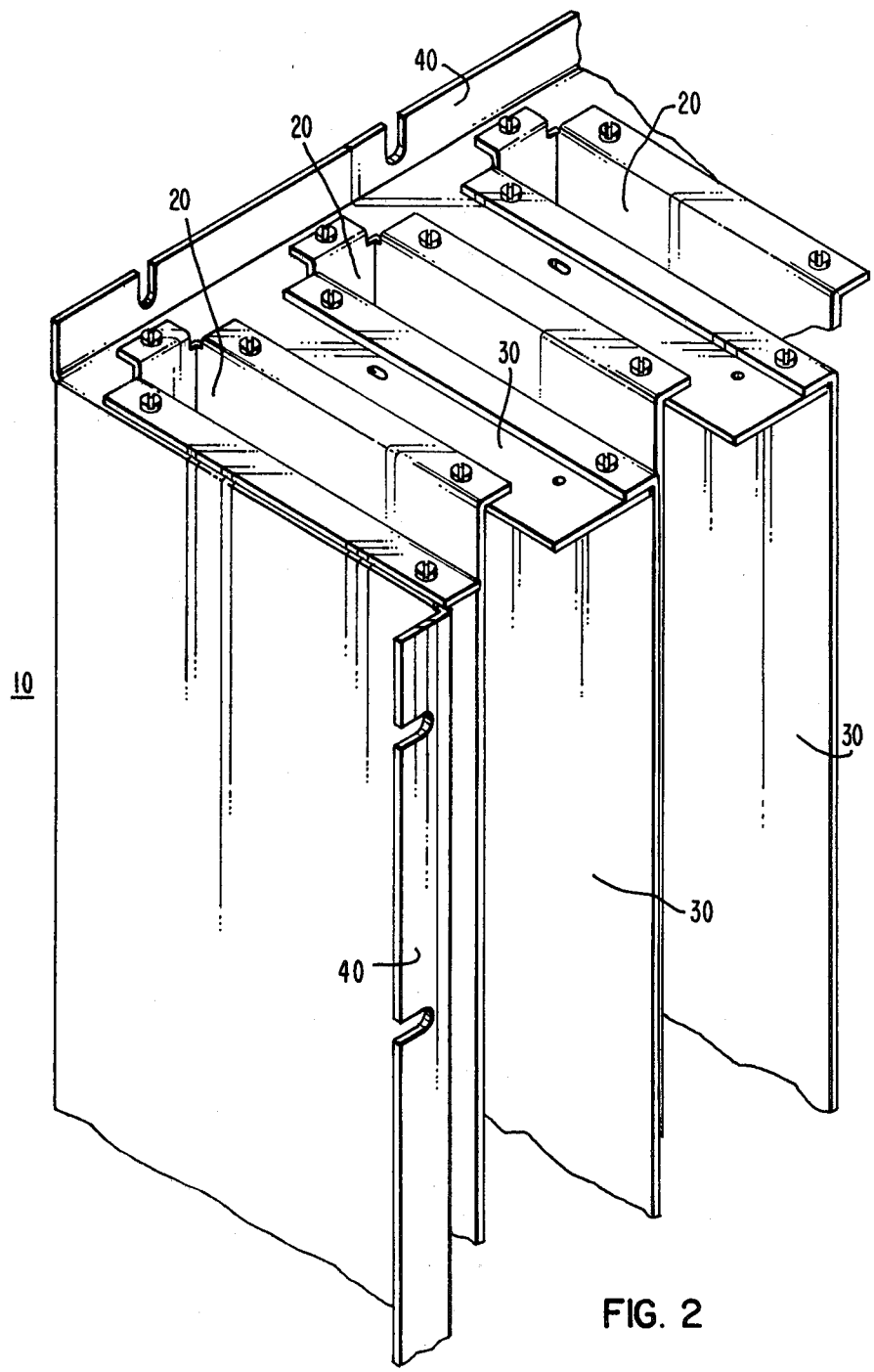
FIG. 2 is a section view of the embodiment of FIG. 1.
Figure 5:
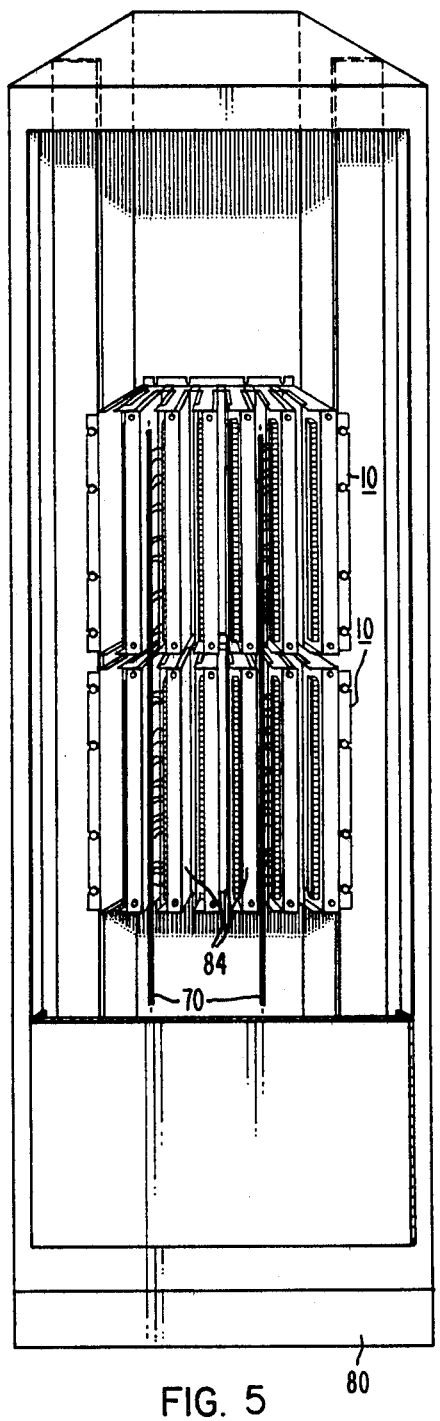
FIG. 5 is a rear view illustration of an instrument cabinet with the termination rack of FIG. 1 mounted in a vertical orientation.
Figure 4:
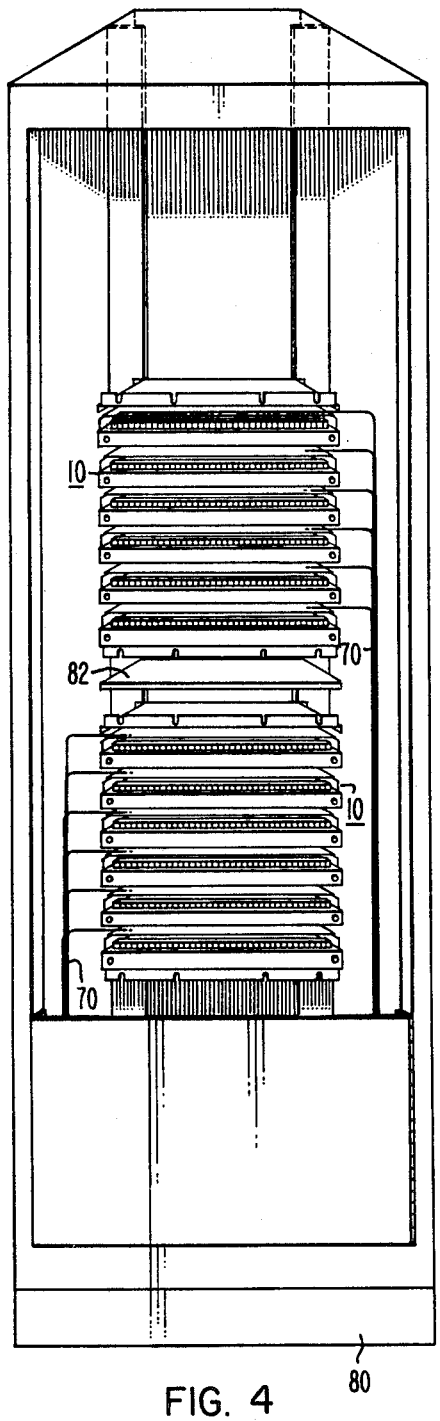
FIG. 4 is a rear view of an instrument cabinet including the termination rack of FIG. 1 mounted in a horizontal orientation.

Referring to FIGS. 1 and 2 there is illustrated a termination rack 10 comprised of alternate open cable troughs 20 and enclosed printed circuit board housings 30 each including printed circuit board insert terminals 32. The height and width dimensions of the termination rack 10 are identical and are such that the mounting flanges 40 permit the installation of the rack 10 in a conventional instrument cabinet with the cable troughs and printed/circuit board housings 30 in either a horizontal orientation as illustrated in FIG. 4 or a vertical orientation as illustrated in FIG. 5. Side walls 31, top and bottom walls 33 combine with an end plate 35 to form the housings 30.

Figure 3:
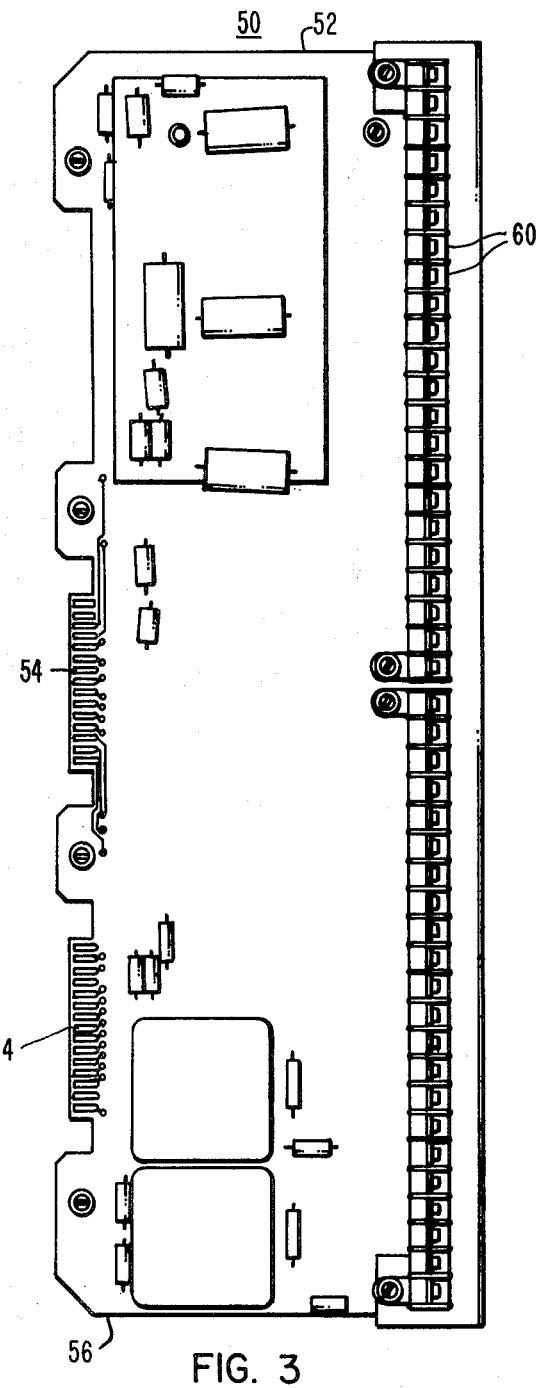
FIG. 3 illustrates an embodiment of a printed circuit board/field terminal connector assembly to be inserted in the termination rack of FIG. 1.

The printed circuit board assembly 50 which is positioned within the housing 30 is illustrated in FIG. 3 as consisting of the printed circuit board 52 having terminations 54 for insertion in the connector 32, in combination with a screw-type terminal strip interconnect member 60 providing field wire connections to the printed circuit board 52. The printed circuit board assembly 50 is mechanically retained within the housing 30 by a printed circuit board edge retainer 34 which engages the edge 56 of the printed circuit board 52.

In the termination rack configuration of FIGS. 1 and 2 the electrical cables 70 associated with the printed circuit board assemblies 50 secured within the respective printed circuit board housings 30 are located within cable troughs 20 associated with the housings 30. In this termination rack configuration the cable troughs are an integral part of the termination rack. The location of the cabling 70 associated with each of the respective printed circuit board assemblies in a designated cable trough 20 permits easy field replacement of printed circuit board assemblies without disconnecting cabling from other assemblies. Additionally, the comb-like cable trough arrangement depicted in FIGS. 1 and 2 effectively distributes the cable trough area, thus allowing high density wiring.

Further versatility can be realized through the selection of the horizontal or vertical orientation of the termination rack 10 within an instrumentation cabinet 80 as illustrated in FIGS. 4 and 5. In the event it is necessary to physically and electrically isolate the printed circuit board assemblies 50 and the associated cabling 70 of adjacent termination racks 10 the termination racks 10 can be mounted in a horizontal position as illustrated in FIG. 4, with the cabling 70 of the respective termination racks 10 entering from opposite sides of the cabinet 80. A separation barrier 82 can be employed to physically separate the operating environments of the cabinet 80 within which the racks 10 are located. When physical and/or electrical isolation is not required, the termination racks 10 can be mounted within the cabinet 80 in a vertical orientation as illustrated in FIG. 5 so as to vertically align the cable troughs 20 of the termination racks 10 to create cable passages 84 extending from top to bottom of the cabinet 80.

We claim:

1. A versatile printed circuit board termination rack assembly for mounting in an instrument cabinet, comprising, a rack means including means for securing said rack means within an instrument cabinet, said rack means including alternate electrical cable troughs and printed circuit board enclosures, said printed circuit board enclosures are elongated rectangular enclosures having an open end to accomodate the insertion of a printed circuit board assembly, said enclosures including electrical connector means to mate with a printed circuit board assembly inserted within the enclosure, said cable troughs alternately located between said printed circuit board enclosures corresponding to passages provided by the spacing between adjacent printed circuit board enclosures to accommodate the electrical cabling for connection to a printed circuit board assembly positioned within the printed circuit board enclosure, the height and width dimensions of said rack means being equal such that said rack means may be mounted in an instrument cabinet with said printed circuit board enclosures being oriented vertically or horizontally, the horizontal mounting of the rack means resulting in isolation between the cable troughs of adjacently mounted rack means, the vertical mounting of adjacent rack means resulting in vertical alignment of the cable troughs of adjacently mounted rack means.

2. In combination, a rack means including means for securing said rack means within an instrument cabinet, said rack means including alternate electrical cable troughs and printed circuit board enclosures, said enclosures including a first electrical connector means to mate with a printed circuit board assembly inserted within the enclosure, said cable troughs alternately located between said printed circuit board enclosure corresponding to passages provided by the spacing between adjacent printed circuit board enclosures to accommodate the electrical cabling for connection to a printed circuit board assembly, and each of said printed circuit board enclosures being an elongated rectangular enclosure having an open end to accommodate the insertion of a printed circuit board assembly, said electrical connector means being positioned within said enclosure at an end opposite said open end, printed circuit board assemblies inserted within said enclosures, each printed circuit board assembly including a printed circuit board, a second electrical connector means on one edge of said printed circuit board for mating with said first electrical connector means when said printed circuit assembly is fully inserted within an enclosure, and an electrical cable connector means attached to the opposite edge of said printed circuit board so as to be positioned in said open end of said enclosure when said assembly is fully inserted within said enclosure, and electrical cables extending in said electrical cable troughs for electrical connection to the electrical cable connector means of the printed circuit board assembly positioned within an adjacent printed circuit board enclosure.

* * * * *